(12) United States Patent
Kawakami et al.

(10) Patent No.: US 7,227,178 B2
(45) Date of Patent: Jun. 5, 2007

(54) SWITCHING ELEMENT

(75) Inventors: Haruo Kawakami, Tokyo (JP); Hisato Kato, Tokyo (JP); Takuji Iwamoto, Kanagawa (JP)

(73) Assignee: Fuji Electric Holdings Co., Ltd. (JP)

( * ) Notice: Subject to any disclaimer, the term of this patent is extended or adjusted under 35 U.S.C. 154(b) by 0 days.

(21) Appl. No.: 10/545,855

(22) PCT Filed: Feb. 13, 2004

(86) PCT No.: PCT/JP2004/001571

§ 371 (c)(1),
(2), (4) Date: Nov. 16, 2005

(87) PCT Pub. No.: WO2004/073079

PCT Pub. Date: Aug. 26, 2004

(65) Prior Publication Data

US 2006/0102892 A1    May 18, 2006

(30) Foreign Application Priority Data

Feb. 14, 2003  (JP)  ............... 2003-035996
Mar. 31, 2003  (JP)  ............... 2003-096183

(51) Int. Cl.
*H01L 29/08* (2006.01)
(52) U.S. Cl. .......................................... 257/40; 257/2
(58) Field of Classification Search .......... 257/40, 257/2–5
See application file for complete search history.

(56) References Cited

U.S. PATENT DOCUMENTS

| 3,833,894 A | 9/1974 | Aviram et al. |
| 4,652,894 A | 3/1987 | Potember et al. |
| 5,334,856 A * | 8/1994 | Otsuka et al. ................ 257/40 |
| 2003/0129368 A1 | 7/2003 | Berneth |
| 2006/0102892 A1 | 5/2006 | Kawakami et al. |

FOREIGN PATENT DOCUMENTS

| EP | 0 109 240 A1 | 5/1984 |
| JP | 52-083594 A | 7/1977 |

(Continued)

OTHER PUBLICATIONS

Ma, L.P. et al.; "Data Storage with 0.7 nm Recording Marks on a Crystalline Organic Thin Film by a Scanning Tunneling Microscope"; Applied Physics Letters: Aug. 10, 1998; vol. 73, No. 6.: p. 850-852.

(Continued)

*Primary Examiner*—Sara Crane
(74) *Attorney, Agent, or Firm*—Rossi, Kimms & McDowell LLP

(57) ABSTRACT

The present invention provides a switching element in which an organic bistable material is disposed between two electrodes, this element having a high ratio of ON current to OFF current, a high threshold voltage, and a small spread. A switching element in which an organic bistable material layer comprising an organic bistable material having two stable values of resistance with respect to the applied voltage is disposed between at least two electrodes, wherein an organic material layer is provided between the organic bistable material layer and at least one of the electrodes. Electrically conductive fine particles are preferably dispersed in the organic materials layer.

7 Claims, 4 Drawing Sheets

FOREIGN PATENT DOCUMENTS

| JP | 63-241548 A | 10/1988 |
|---|---|---|
| JP | 5-80374 A | 4/1993 |
| JP | 05080374 A | 4/1993 |
| JP | 2000-012922 A | 1/2000 |
| JP | 2001-160492 A | 6/2001 |
| JP | 3199430 B2 | 6/2001 |
| JP | 3313405 B2 | 5/2002 |
| JP | 2002-324683 A | 11/2002 |
| WO | 02/37500 A1 | 5/2002 |
| WO | WO 02/37500 A1 | 5/2002 |
| WO | 2004/073079 A1 | 8/2004 |
| WO | 2004073079 A1 | 8/2004 |

OTHER PUBLICATIONS

Haruo Kawakami et al.; "Electric bistable characteristics of aminoimidazole carbonitrile"; The Japan Society of Applied Physics and Related Societies No. 3; Issue date: Mar. 27, 2003; 29p- B-8; p. 1340; English Abstract.

Related co-pending U.S. Appl. No. 10/545,854; Kawakami et al.; "Switching Element"; filed Aug. 17, 2005; Spec. pp. 1-45; Figs. 1-20; Preliminary Amendment.

Kawakami, et al., Organic Bistable Devices with High Switching Voltage, Fuji Electric Advanced Technology Corporate Ltd., Organic Field-Effect Transistors III, pp. 9-16, Proceedings of SPIE vol. 5522, SPIE, Bellingham, WA, Oct. 2004.

Kawakami, et al., Electrical Bistable Behaviors of Organic Materials in Single Layer Structure, Fuji Electric Corporate Research & Development Ltd., Organic Field Effect Transistors II, pp. 71-79, Proceedings of SPIE vol. 5217, SPIE, Bellingham, WA, Nov. 2004.

Ma, et al., Nonvolatile Electricity Bistability of Organic/Metal-Nanocluster/Organic System, Department of Materials Science and Engineering, University of California at Los Angles, CA, pp. 1419-1421, Applied Physics Letters, vol. 82, No. 9, Mar. 2003.

Ma, et al., Organic Electrical Bistable Devices and Rewritable Memory Cells, Department of Materials Science and Engineering, University of California at Los Angles, CA, pp. 2997-2999, Applied Physics Letters, vol. 80, No. 16, Apr. 2002.

Ma, et al., Organic Bistable Light-Emitting Devices, Department of Materials Science and Engineering, University of California at Los Angles, CA. pp. 362-364, Applied Physics Letters, vol. 80, No. 3, Jan. 2002.

Relevant portion of Partial European Search Report of corresponding PCT Application EP/04711724.

Horiuchi et al, "Quantum Phase Transition in Organic Charge-Transfer Complexes," SCIENCE, Jan. 10, 2003, pp. 229-232, vol. 299 Jan. 2003; XP-002384365; www.sciencemag.org.

Kumai, et al, "Current-Inducing Metallization and Stripe Pattern Formation of K-TCNQ crystals", Kotai Butsuri, 35 (2000) 35, Partial English Translation.

Adachi, et al, Oyo Butsuri Gakkai Yokoshu, Mar. 2002, Third Issue, 27a-M-5, p. 1236.

Potember, R.S., et al, Electrical switching and memory phenomena in Cu-TCNQ thin films, Appl. Phys. Lett. 34(6), Mar. 15, 1979, p. 405-407.

Relevant portion of European Search Report of corresponding European Application 04711724.7-2203.

Ma, L.P. et al.; "Organic Electrical Bistable Devices and Rewritable Memory Cells", Applied Physics Letter; Apr. 22, 2002; pp. 2997-2999; vol. 80, No. 16; American Institute of Physics; USA.

Horiuchi, S. et al.; "Quantum Phase Transition in Organic Charge-Transfer Complexes"; Science; Jan. 10, 2003; pp. 229-232; vol. 299; American Association of Advanced Science; USA.

* cited by examiner

SWITCHING ELEMENT

TECHNICAL FIELD

The present invention relates to a switching element in which an organic bistable layer is disposed between two electrodes, this element being suitable as a switching element for driving the organic EL display panels or for a high-density memory.

BACKGROUND ART

In recent years, characteristics of organic electronic materials have been remarkably improved. In particular, the so-called organic bistable materials where, if a voltage is applied to the material, an electric current in a circuit rapidly increases at a voltage above a certain value and a switching phenomenon is observed have found application for switching elements for driving the organic EL display panels or for high-density memories.

FIG. 8 shows an example of a voltage-current characteristic of an organic bistable material demonstrating the above-described switching behavior.

As shown in FIG. 8, the organic bistable material has two current-voltage characteristics: a high-resistance characteristic 51 (OFF state) and a low-resistance characteristic 52 (ON state), and a nonlinear response characteristic such that if a bias Vb is applied in advance and then the voltage is raised to a threshold voltage (Vth2) or higher, a transition is made from the OFF state to the ON state, and if the voltage becomes equal to or less than another threshold voltage (Vth1), then a transition is made from the ON state to the OFF state and the resistance value changes.

In other words, the so-called switching operation can be performed by applying a voltage of Vth2 or higher or Vth1 or lower to the organic bistable material. Here, Vth1, Vth2 can be also applied as pulse voltages.

A variety of organic complexes are known as the organic bistable materials demonstrating such nonlinear response. For example, R. S. Potember et al. fabricated a switching element having two stable resistance values with respect to a voltage by using a Cu-TCNQ (copper-tetracyanoquinodimethane) complex (R. S. Potember et al. *Appl. Phys. Lett.* 34, (1979) 405).

Further, Kumai et al. used a single crystal of a K-TCNQ (potassium-tetracyanoquinodimethane) complex and observed the switching behavior caused by the nonlinear response (Kumai et al. *Kotai Butsuri*, 35 (2000) 35).

Furthermore, Ando et al. formed a thin film of a Cu-TCNQ complex by using a vacuum vapor deposition method, clarified switching characteristics thereof and investigated the possibility of application to an organic EL matrix (Ando et al. Preprints of Applied Physics Association Conference, Spring 2000, Vol. 3, 1236).

Further, with respect to the charge-transfer complexes composed of the above-described two components, Yang et al. obtained with an organic film composed of a single component a switching characteristic similar to that of the charge transfer complexes by sandwiching a very thin Al film with 2-amino-4,5-imidazole dicarbonitrile thin films (Yang Yang et al. *Appl. Phys. Lett.* 80, (2003) 362). With such configuration, because each complex is a thin film composed of a single component, the composition controllability is significantly improved over that of the conventional charge transfer complexes of two-component systems.

However, the above-described switching element using an organic material composed of a single molecule has the following problems.

Thus, the voltage Vth2 value that causes the transition from the OFF state to the ON state shown in FIG. 8 has a large spread and the characteristic is not stable. The cause of this spread has not yet been clarified. Apparently, very small peaks and valleys are present on the interface of the organic material layer and metal electrodes, and when a transition from the OFF state to the ON state occurs, an electric charge is injected into the organic material film due to electric field concentration on those peaks and valleys. At this time, the peaks and valleys on the interface are determined by the flatness of the organic material film, but because those very small peaks and valleys are difficult to control, the spread of Vth2 values occurs inevitably.

Further, when this switching characteristic is applied to driving other elements, a Vth2 value exceeding the operation voltage of the element to be driven is required for the organic bistable element. The problem is that, for example, in organic EL display panels and the like, this value has to be 10 V or higher, but in the above-described conventional switching elements the Vth2 value is as low as 3–5 V.

Moreover, in applications for organic EL display panels, memories, and the like, the above-described bistable material is usually used in a simple matrix configuration. In such simple matrix configuration, electrodes are locally formed as a pattern on an insulating substrate (usually, a glass substrate is used), the insulating substrate and electrodes appear alternately as a prime layer, and the above-described organic bistable material is formed, for example, by vapor deposition on the substances of two different types.

Here, the above-described organic bistable material is in the form of molecules with a comparatively low molecular weight that have electron-donating groups and electron-accepting groups, and a specific feature thereof is that they easily grow as grains because polarization is high. As a result, though a dense film is formed as small grains on the metal electrodes, larger grains are easily formed on the flat glass substrate having an amorphous structure.

For this reason, the problem associated with the conventional simple matrix configuration is that because the organic bistable film present on the glass substrate forms large grains, a large leakage current is generated on grain boundaries of the organic bistable film present on the glass substrate adjacent to the electrodes and this current increases the OFF current, thereby greatly reducing the ratio of the ON current of switching to the OFF current.

The present invention was created to resolve the above-described problems of the conventional technology and it is an object thereof to obtain an organic bistable element With a large Vth2 value, a small spread, and a large ratio of the ON current to the OFF current in a switching element in which an organic bistable material is disposed between two electrodes.

DISCLOSURE OF THE INVENTION

The present invention provides a switching element in which an organic bistable material layer comprising an organic bistable material having two stable values of resistance with respect to the applied voltage is disposed between at least two electrodes, wherein an organic material layer is provided between the organic bistable material layer and at least one of the electrodes.

With the switching element in accordance with the present invention, peaks and valleys present on the electrode surface formed on the insulating substrate having peaks and valleys of the nanometer order are smoothed out by the organic material layer and the organic bistable material layer is uniformly formed on the organic material layer with a small surface roughness. Therefore, a homogeneous and dense organic bistable material layer can be formed.

As a result, an electric field applied to the usual bistable element during the transition from the OFF state to the ON state is $10^7$–$10^8$ (V/m), but when peaks and valleys are present on the film surface, the electric current locally further increases due to electric field concentration on the peaks and valleys. The Vth2 value can be controlled by controlling this electric field concentration.

Further, with such configuration, large crystal grains are not produced on the boundaries with the insulating substrate and with the metal electrodes, as in the conventional configuration. For this reason, the leakage current originating on the grain boundaries of large crystal grains of the organic bistable material layer that are formed on the boundary with the insulating substrate and with the metal electrodes is presented. Therefore, the OFF current can be reduced and a switching element with a large ratio of the ON current to the OFF current can be obtained.

In accordance with the present invention, it is preferred that electrically conductive fine particles be dispersed in the organic material layer.

With this feature, the organic material layer can be provided with an appropriate conductivity function. The resultant effect is that the ON current can be increased.

Further, in accordance with the present invention, it is preferred that the mean particle size of the electrically conductive fine particles be 5 nm or less and equal to or greater than the surface roughness Ra of the electrode that is in contact with the organic material layer.

With this feature, the threshold voltage Vth2 shown in FIG. 8 can be stabilized. This is because the spread of the Vth2 value is decreased by inhibiting the spread of electric field concentration. Thus, in this configuration, because the size of fine metal particles present in the layer with dispersed fine particles is equal to or larger than the surface roughness of the electrode, the electric field concentration occurs on those fine metal particles. Since the shape and size of the fine metal particles can be controlled, the Vth2 value can be controlled. As a result, a stable transition characteristic can be realized. On the other hand, the Vth2 value can be increased by reducing the fine particle diameter of 5 nm or less.

Further, in accordance with the present invention, it is preferred that the electrically conductive fine particles be from platinum and/or rhodium.

The effect obtained with this feature is that the electrically conductive fine particles are resistant to oxidation and can be present with good stability in air.

Further, in accordance with the present invention, it is preferred that the surface roughness Ra in the organic material layer on the side of the organic bistable material layer be 1 nm or less.

With this feature, the electric field concentration occurring on the surface peaks and valleys in the organic bistable material layer can be eliminated. As a result, the Vth2 value can be increased.

Further, in accordance with the present invention, it is preferred that the organic material constituting the organic material layer be at least one species selected from polycarbonates, polyesters, polyvinyl alcohol, polystyrene, polyvinyl pyrrolidone, polyimides, polyacrylic acid, polyethylene imine, tetramethylammonium, and citric acid.

With this feature, the aforementioned compound is stable in the air and a coating method such as spin coating can be easily applied. Therefore, it can be especially advantageously used for the present invention.

Further, in accordance with the present invention, it is preferred that the organic material layer be formed by a coating method.

With this feature, the electrode surface can be easily smoothed, and this method is especially advantageous for producing an organic material layer with a surface roughness Ra of 1 nm or less.

Further, in accordance with the present invention, it is preferred that the organic bistable material comprise at least one compound having an electron-donating functional ground and an electron-accepting functional group in a molecule.

With this feature, because the organic bistable material is a one-component system, the composition controllability can be greatly improved by comparison with the conventional charge transfer complexes comprising two-component systems.

BEST MODE FOR CARRYING OUT THE INVENTION

Figure 1:
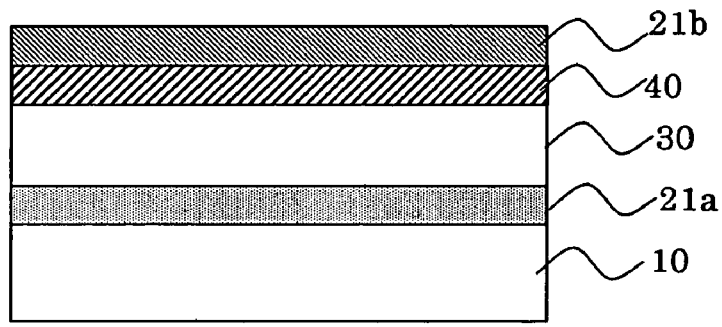
FIG. 1 is a schematic structural drawing illustrating an embodiment of the switching element of the present invention.
Figure 2:
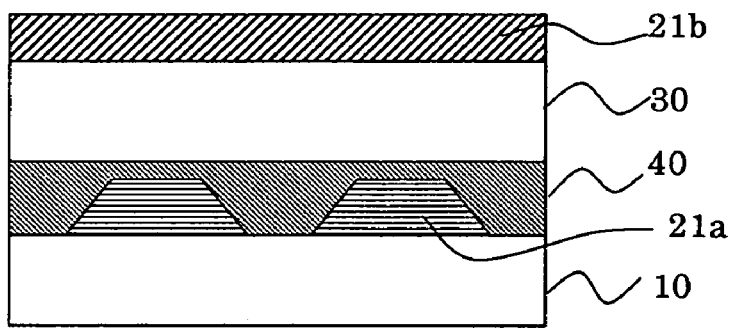
FIG. 2 is a schematic structural drawing illustrating another embodiment of the switching element of the present invention.

The present invention will be described below in greater detail with reference to the drawings. FIG. 1 and FIG. 2 are schematic structural drawings illustrating two embodiments of the switching element of the present invention.

As shown in FIG. 1, the switching element has a configuration in which an electrode layer 21a, a bistable material layer 30, an organic material layer 40, and an electrode layer 21b are successively laminated on a substrate 10.

The configuration of the switching element in accordance with the present invention is not limited to that shown in FIG. 1. For example, as shown in FIG. 2, a configuration may be employed in which an electrode layer 21a that is locally formed, an organic material layer 40, a bistable material layer 30, and an electrode layer 21b are successively laminated on a substrate 10.

First, the materials constituting the above-described switching element will be described.

No specific limitation is placed on the material for the substrate 10, but a conventional glass substrate having insulating properties is preferably used therefor.

No specific limitation is placed on the materials for the electrode layers 21a, 21b and metal materials such as aluminum, gold, silver, nickel, and iron, inorganic materials such as ITO and carbon, conjugated organic materials, organic materials such as liquid crystals, and semiconductor materials such as silicon can be appropriately selected therefor.

Organic bistable compounds comprising at least a compound having an electron-donating functional group and an electron-receiving functional group in a molecule are preferred as the bistable material constituting the bistable material layer 30, but this selection is not limiting and any material having bistability may be used.

Examples of such organic bistable compounds include well known compounds such as aminoimidazole-based compounds, dicyano-based compounds, pyridon-based compounds, imine-based compounds, quinine-based compounds, styryl-based compounds, stilbene-based compounds, and butadiene-based compounds, but this list is not limiting.

No specific limitation is placed on the material for the organic material layer 40, provided that it smoothes peaks and valleys on the surface of the electrode layers having peaks and valleys of a nanometer (nm) order and formed on the substrate 10. Examples of the preferred organic materials include polycarbonates, polyesters, polyvinyl alcohol, polystyrene, polyvinyl pyrrolidone, polyimides, polyacrylic acid, polyethyleneimine, tetramethylammonium, and citric acid.

Further, fine particles having electric conductivity are preferably dispersed in the organic material layer 40. Examples of electrically conductive fine particles include fine particles of platinum, rhodium, gold, copper, and aluminum, the especially preferred among them being fine particles of platinum and rhodium.

It is preferred that a mean particle size of those electrically conductive fine particles be 5 nm or less and equal to or higher than the surface roughness Ra of the electrodes that are in contact with the organic material layer.

Figure 8:
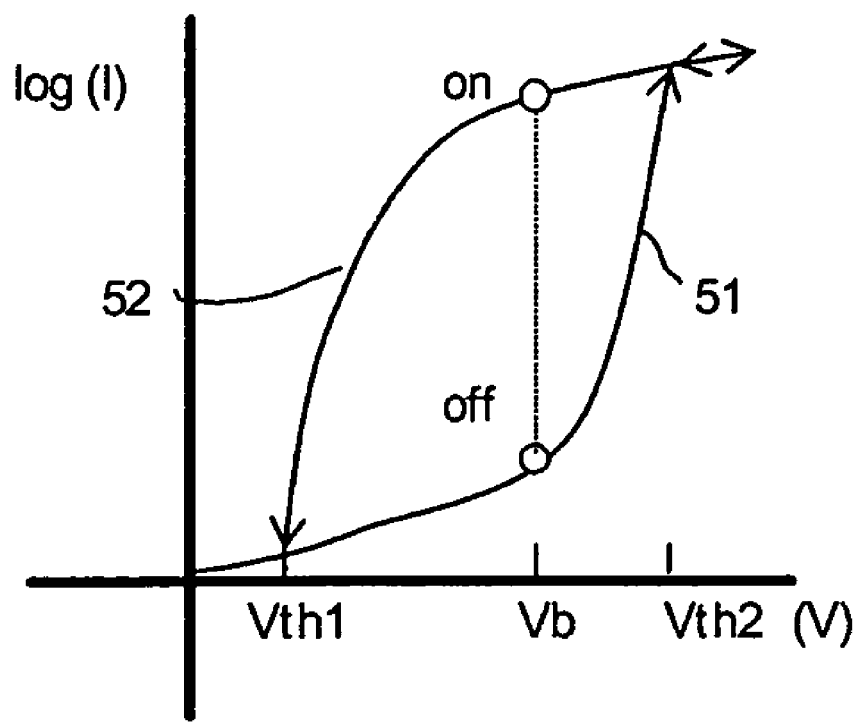
FIG. 8 is a diagram schematically illustrating a voltage-current characteristic of the conventional switching element.

As a result, the spread of electric field concentration is inhibited and the spread of the threshold voltage Vth2 in FIG. 8 can be reduced. Thus, in this configuration, because the fine metal particles present in the layer containing dispersed fine particles are larger than the surface roughness of the electrodes, the electric field concentration occurs at those fine metal particles. Further, because the shape and size of the fine metal particles can be controlled in advance, the threshold voltage Vth2 can be controlled. As a result, a stabilized transition characteristic can be realized.

For example, the surface roughness of an aluminum electrode film grown on a glass substrate by vacuum vapor deposition is usually within a range of about Ra=1–3 nm. The smaller is the roughness, the lower is the electric field concentration and the higher is the Vth2. The larger is the roughness, the smaller is the Vth2 value. When electrically conductive particles larger than the surface roughness of the electrode film are dispersed in the organic material film, the electric field concentration increases on the electrically conductive particles. Therefore, the spread of the Vth2 value can be decreased by suppressing the spread of the conductive particle diameter to less than the spread of the surface roughness of the electrode film.

For example, if a layer comprising fine metal particles with a mean particle size of 4±0.5 nm is formed on the surface of an aluminum electrode with a surface roughness Ra having a spread of 1–3 nm, then the electric field concentration will occur on the fine metal particles. Therefore, the absolute value of Vth2 will decrease. However, the spread of the Vth2 value can be reduced by inhibiting the spread of the diameter of fine metal particles.

On the other hand, it is undesirable that the diameter of fine particles increase to more than 5 nm, because the reduction of Vth2 value becomes significant.

The surface roughness Ra as referred to herein is a value measured according to JIS-B0601.

A method for manufacturing the above-described switching element will be described below.

The aforementioned electrode layer 21a, organic material layer 40, bistable material layer 30, and electrode layer 21b are preferably formed as thin films in the order of description on the substrate 10.

No specific limitation is placed on a method for forming the electrode layers 21a, 21b and well-known conventional methods such as vacuum vapor deposition can be used therefor. In particular, when the first electrode layer 21a is locally formed on the substrate 10, as shown in FIG. 2, mask deposition on the substrate is preferably conducted under vacuum by a vacuum vapor deposition method using a shadow mask, but this method is not limiting and other well-known conventional methods such as a photoprocess can be used.

No specific limitation is placed on the method for forming the bistable material layer 30, and methods for manufacturing organic thin film such as a spin coating method, an electrolytic polymerization method, a chemical vapor deposition method (CVD method), a monomolecular film deposition method (LB method), a dipping method, a bar coating method, an ink jet printing method, and a screen printing method can be used. A vacuum vapor deposition method identical to that of the above-described electrode layers is preferably used.

The substrate temperature during vapor deposition is appropriately selected according to the electrode material and bistable material used. When the electrode layers 21a, 21b are formed, the temperature is preferably 0–150° C., and when the bistable material layer 30 is formed, the temperature is preferably 0–100° C.

When the bistable material layer 30 is formed by a coating method, halogenides such as dichloromethane, dichloroethane, and chloroform, ethers such as tetrahydrofuran and ethylene glycol dimethyl ether, aromatic compounds such as toluene and xylene, alcohols such as ethyl alcohol, esters such as ethyl acetate and butyl acetate, ketones such as acetone, MEK, and also acetonitriles can be advantageously used as a solvent for coating, but this list is not limiting.

A coating liquid may be prepared by dissolving the bistable material at a mass ratio within a range of 0.001–30% in the aforementioned solvent and adding, if necessary, a binder resin. As a binder resin, it is possible to apply materials include polycarbonates, polyesters, polyvinyl alcohol, and polystyrene, but those resins are not limiting.

As for the spin coating conditions, the rotation rate can be selected within a range of 200–3600 rpm according to the target film thickness, but this range is not limiting.

Similarly to the method for forming the above-described bistable material layer 30, methods for manufacturing organic thin films such as vacuum deposition method, a spin coating method, electrolytic polymerization method, chemical vapor deposition method (CVD method), monomolecular film deposition method (LB method), dipping method, bar coating method, ink jet printing method, and screen printing method can be used for forming the organic material layer 40, but those methods are not limiting.

In particular, when a metal such as platinum and rhodium is used for fine particles, an alcohol such as ethyl alcohol, methyl alcohol, propyl alcohol, a glycol such as ethylene glycol, an ether such as tetrahydrofuran (THF) and ethylene glycol dimethyl ether, or pure water that can easily disperse the aforementioned materials are preferably used as the solvent for forming the organic material layer 40 by a coating method, but those solvents are not limiting.

A coating liquid can be obtained by dissolving the organic material in the aforementioned solvent at a mass ratio within a range of 0.001–30% and simultaneously or consecutively dispersing fine electrically conductive particles within a range of 0.001–30%. As for the spin coating conditions, the rotation rate can be selected within a range of 200–3600 rpm according to the target film thickness, but this range is not limiting.

The organic material layer 40 preferably has a surface roughness Ra of 1 nm or less on the side that is in contact with the bistable material layer 30. If the surface roughness Ra is more than 1 nm, the electric field concentration induced by surface peaks and valleys occurs in the bistable material layer 30. The undesirable result thereof is that the Vth2 value cannot be increased.

As for the thickness of each layer, the thickness of electrode layers 21a, 21b is preferably 50–200 nm, the thickness of the organic material layer 40 is preferably 3–200 nm, and the thickness of the bistable material layer 30 is preferably 20–150 nm.

In the switching element in accordance with the present invention that is obtained by the above-described manufacturing method, a uniform flat surface having no surface peaks and valleys is formed by the organic material layer. Therefore, the organic bistable material is also uniformly formed over a large surface area and a dense structure can be obtained within the entire film.

As a result, in a switching element using an organic bistable material having both the donor and the acceptor functions in a single molecular composition, the threshold voltage Vth2 can be stabilized and increased. Furthermore, a leakage current occurring on the ground boundaries of the organic film present on the interface of the insulating substrate and metal electrodes can be reduced.

The switching element in accordance with the present invention will be described below in greater detail by using working examples thereof.

WORKING EXAMPLE 1

The switching element with a configuration shown in FIG. 1 was produced by the following procedure.

The switching element of Working Example 1 was formed by using a glass substrate as the substrate 10 and successively forming thin films by vacuum vapor depositing aluminum as the electrode layer 21a, spin coating a dicyano compound as the bistable material layer 30, spin coating the organic material layer 40, and vacuum vapor depositing aluminum as the electrode layer 21b.

A compound of the below-described structural formula was used as the dicyano compound. Coating of the dicyano compound was conducted by using THF as a coating solvent, dissolving the dicyano compound to 1.0 wt. %, and forming a film by a spin coating method at a revolution speed of 2400 rpm.

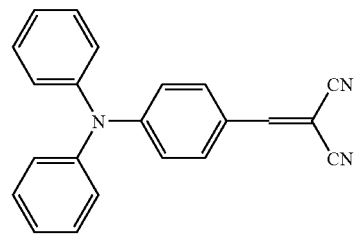

Further, the organic material layer 40 was obtained by dispersing 0.1 wt. % fine platinum particles with a mean particle diameter of 2 nm in pure water, dissolving polyvinyl alcohol at 0.05 wt. %, and using the liquid obtained to form a film by a spin coating method at a revolution speed of 3600 rpm.

Further, the electrode layer 21a, bistable material layer 30, organic material layer 40, and electrode layer 21b were formed to have a thickness of 100 nm, 80 nm, 5 nm, and 100 nm, respectively.

The vapor deposition apparatus had a diffusion pump gas discharge and the degree of vacuum was $3 \times 10^{-6}$ Torr. Vapor deposition of aluminum was conducted by a resistance heating method at a film formation rate of 3 Å/sec.

WORKING EXAMPLE 2

A switching element of Working Example 2 was obtained under the same conditions as in Working Example 1, except that fine platinum particles with a mean particle diameter of 4 nm were used as the fine metal particles and the thickness of the organic material layer 40 was 10 nm.

WORKING EXAMPLE 3

A switching element of Working Example 3 was obtained by using the compound represented by the structural formula below as the dicyano compound and forming films under the same conditions as in Working Example 1 so that each of the vapor deposited electrode layer 21a, bistable material layer 30, organic material layer 40, and electrode layer 21b had a thickness of 100 nm, 100 nm, 5 nm, and 100 nm, respectively.

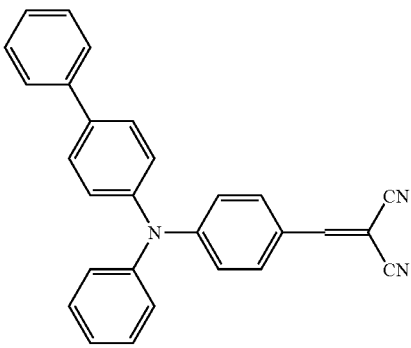

Comparative Example 1

A switching element of Comparative Example 1 was obtained by forming films under the same conditions as in Working Example 1, except that the organic material layer 40 was not formed.

Comparative Example 2

A switching element of Comparative Example 2 was obtained by forming films under the same conditions as in Working Example 3, except that the organic material layer 40 was not formed.

Test Example 1

A current-voltage characteristic was measured in room temperature environment in 20 points for each switching element of above-described Working Examples 1, 2, 3 and the low-threshold voltage Vth1 and high-threshold voltage Vth2 that are the threshold voltages shown in FIG. 8 were measured.

Figure 3:
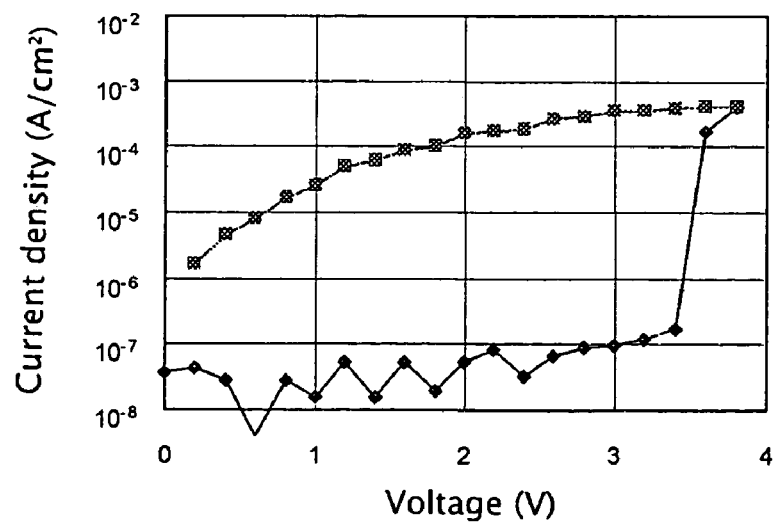
FIG. 3 is a diagram showing a current-voltage characteristic of a switching element in Example 1.
Figure 4:
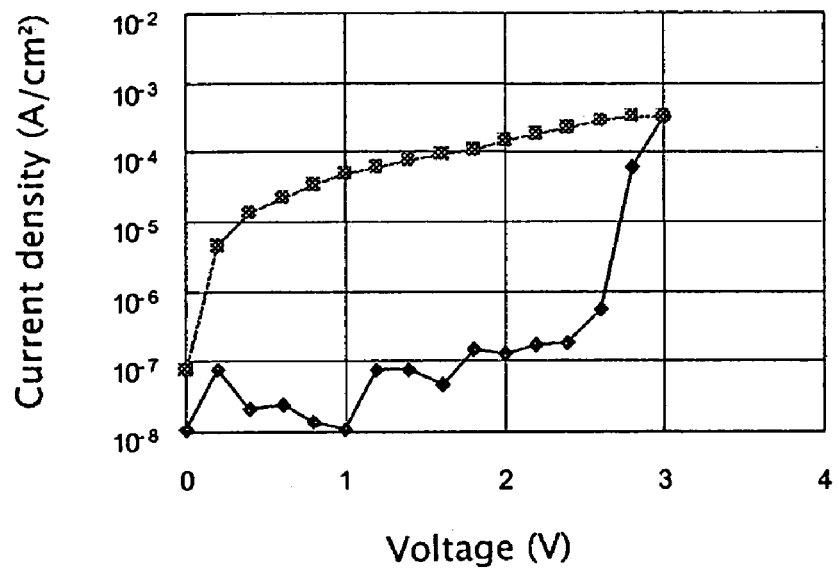
FIG. 4 is a diagram showing a current-voltage characteristic of a switching element in Example 2.
Figure 5:
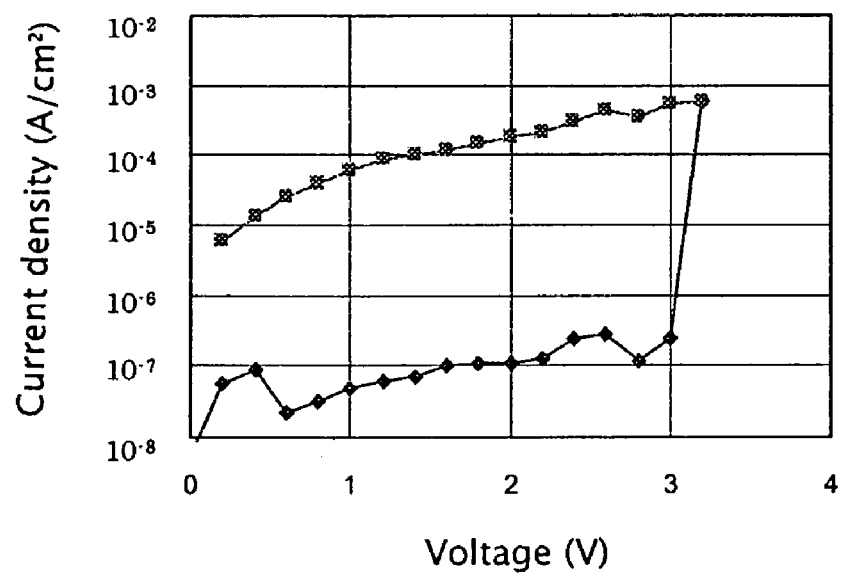
FIG. 5 is a diagram showing a current-voltage characteristic of a switching element in Example 3.

All the results are shown in Table 1. Further, FIGS. 3, 4, 5 show the current-voltage characteristics relating to switching elements of Working Examples 1, 2, 3, respectively.

As for the measurement conditions, an electric resistor of 1 MΩ was connected in series to each switching element, electric current in the ON state was restricted, and damage of the elements caused by overcurrent was inhibited.

TABLE 1

|  | Vth1 (average value) | Vth2 (average value) | (Standard deviation) | (Maximum value) | (Minimum value) |
|---|---|---|---|---|---|
| Working Example 1 | 0.33 | 3.56 | 0.31 | 4.22 | 3.17 |
| Working Example 2 | 0.25 | 2.64 | 0.26 | 3.03 | 2.23 |
| Working Example 3 | −0.12 | 2.95 | 0.35 | 3.57 | 2.56 |
| Comparative Example 1 | −0.45 | 4.21 | 2.07 | 7.56 | 3.22 |
| Comparative Example 2 | −0.24 | 3.78 | 1.87 | 6.84 | 2.81 |

As shown in Table 1, if Working Examples 1, 2 are compared with Comparative Example 1, the average value of Vth2 in Working Examples 1, 2 is less than that in Comparative Example 1, but the spread thereof is suppressed, thereby demonstrating the effect of the present invention. A similar effect is demonstrated in comparing Working Example 3 with Comparative Example 2.

Further, as shown in FIGS. 3 to 5, in Working Examples 1 to 3, the low threshold voltage Vth1 was from −0.12 to 0.33 V, the high threshold voltage Vth2 was from 2.64 to 3.56 V, and a value of about $10^3$ or higher was obtained as the ratio of low-state to high-resistance state. Thus, a good result was obtained as a bistable characteristic.

WORKING EXAMPLE 4

A switching element of the configuration shown in FIG. 2 was produced in the following manner.

Glass was used as the substrate 10, the first electrode layer 21a was formed by patterning aluminum by a vacuum deposition method using a shadow mask on the surface of the glass substrate 10, and then a polyvinyl pyrrolidone film having platinum dispersed therein was coated and the organic material layer 40 was formed.

Then, a switching element of Working Example 4 was formed by successively vapor depositing aminoimidazole dicyanate shown below as a bistable organic layer 30 and mask vapor depositing aluminum as the second electrode layer 21b.

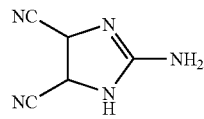

A mixture prepared by mixing 4 wt. % fine platinum particles (manufactured by Tanaka Noble Metals, Ltd.) with an average particle diameter of 2 nm with 10% polyvinyl pyrrolidone solution was used as a starting material for the organic material layer 40. The mixture was diluted by a factor of 20 with ethanol solvent, coated by a spin coating method, and dried for 1 h at a temperature of 110° C.

Further, the electrode layer 21, organic material layer 40, bistable material layer 30, and electrode layer 21b were formed to a film thickness of 100 nm, 40 nm, 80 nm, and 100 nm, respectively.

Vapor deposition of aluminum as the electrode layers 21a, 21b and aminoimidazole dicyanate as the bistable material layer 30 was conducted by diffusion pump discharge under a vacuum of $310^{-6}$ Torr. Vapor deposition of aluminum was conducted by a resistance heating method at a film formation rate of 3 Å/sec. Vapor deposition of aminoimidazole dicyanate was conducted by a resistance heating method at a film formation rate of 2 Å/sec.

WORKING EXAMPLE 5

A switching element of Working Example 5 was obtained by forming the electrode layer 21a, organic material layer 40, bistable material layer 30, and electrode layer 21b to a film thickness of 100 nm, 40 nm, 80 nm, and 100 nm, respectively, under the same conditions as in Working Example 1, except that the below-described quinomethane compound was used for the organic bistable layer and gold was used for the electrode layer 21b.

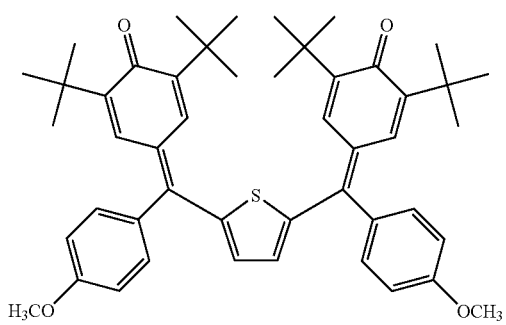

WORKING EXAMPLE 6

A switching element of Working Example 6 was obtained under the same conditions as in Working Example 4, except that a polyvinyl pyrrolidone film having no platinum dispersed therein was formed as the organic material layer 40.

Comparative Example 3

A switching element of Comparative Example 3 was obtained by forming films under the same conditions as in Working Example 4, except that the organic material layer 40 was not formed.

Comparative Example 4

A switching element of Comparative Example 4 was obtained by forming films under the same conditions as in Working Example 5, except that the organic material layer 40 was not formed.

WORKING EXAMPLE 2

Surface roughness Ra was evaluated by using an atomic power microscope. In Comparative Examples 3, 4, the surface roughness was 1.4 nm on the aluminum electrode surface. Furthermore, peaks and valleys caused by patterning of aluminum film were also present. By contrast, the surface of the organic material layer 40 used in Working Examples 4, 5 had a surface roughness Ra of 0.1 nm. In Working Example 6, too, the surface was smooth and the roughness Ra was about 0.1 nm.

A current-voltage characteristic was measured in a room temperature environment with respect to the switching elements of the above-described Working Examples 4 to 6 and Comparative Examples 3, 4 and the transition from a high-resistance state to a low-resistance state was observed. Table 2 shows the results obtained in measuring the threshold voltage Vth2 of transition from a high-resistance state to a low-resistance state at this stage, the current value (ON current) Ion in a low-resistance state and the current value (OFF current) Ioff in a high-resistance state at a bias voltage Vb in FIG. 8.

As for the measurement conditions, an electric resistor of 1 MΩ was connected in series to each switching element, electric current in the ON state was restricted, and damage of the elements caused by overcurrent was inhibited. A half value of the threshold voltage Vth2 was used as Vb.

TABLE 2

| | Vth2 (V) | Ioff (A/cm$^2$) | Ion (A/cm$^2$) | on/off |
|---|---|---|---|---|
| Working Example 4 | 5.4 | $3.8 \times 10^{-8}$ | $1.3 \times 10^{-4}$ | 3421 |
| Working Example 5 | 7.2 | $3.4 \times 10^{-8}$ | $2.1 \times 10^{-4}$ | 6176 |
| Working Example 6 | 8.0 | $2.2 \times 10^{-8}$ | $1.6 \times 10^{-4}$ | 7272 |
| Comparative Example 3 | 1.4 | $9.0 \times 10^{-6}$ | $5.3 \times 10^{-5}$ | 6 |
| Comparative Example 4 | 4.6 | $5.0 \times 10^{-7}$ | $7.6 \times 10^{-5}$ | 152 |

Figure 6:
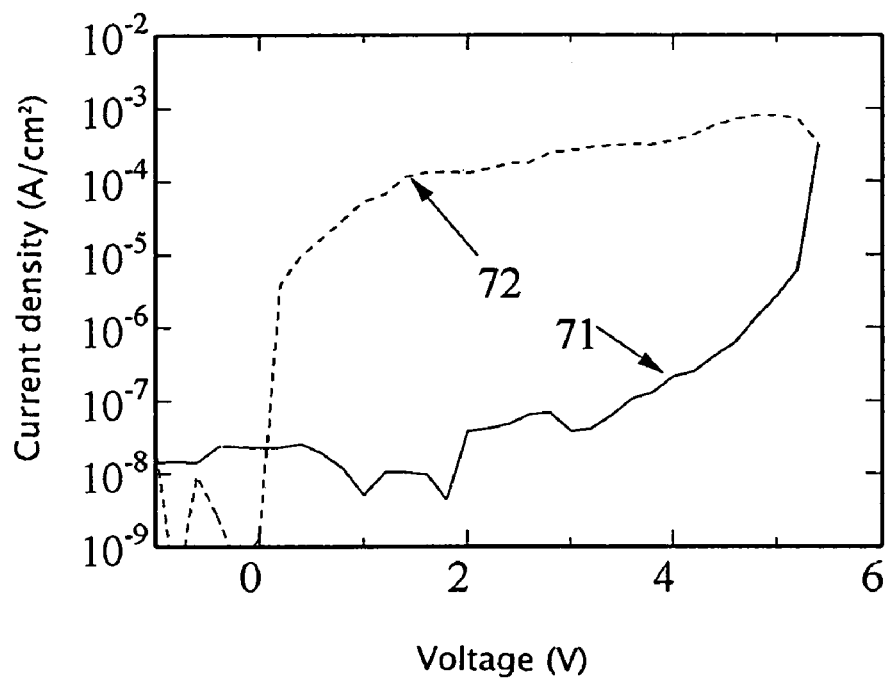
FIG. 6 is a diagram showing a current-voltage characteristic of a switching element in Example 4.
Figure 7:
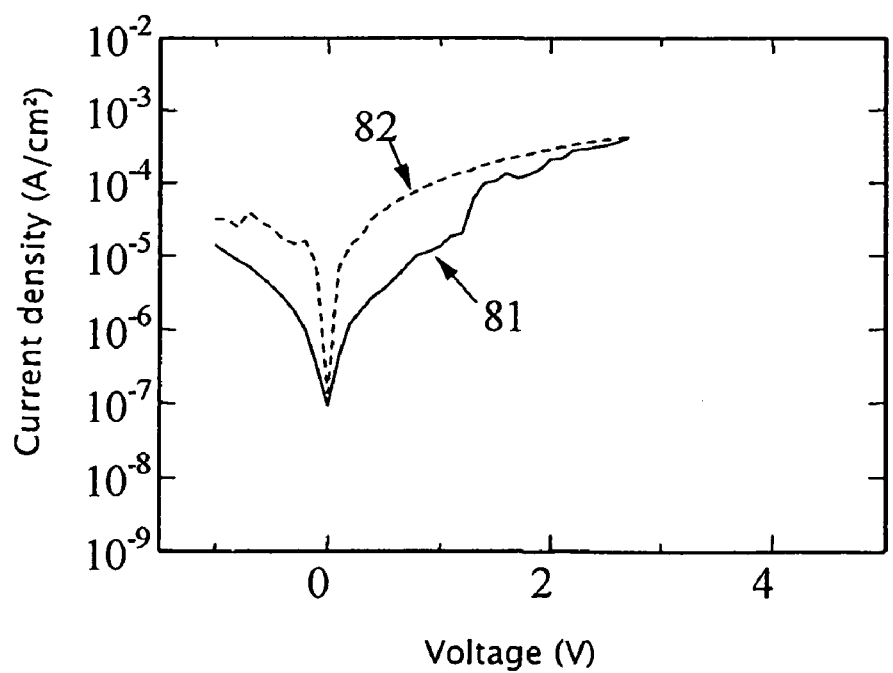
FIG. 7 is a diagram showing a current-voltage characteristic of a switching element in Comparative Example 3.

Further, the current-voltage characteristics relating to the switching elements of Working Example 4 and Comparative Example 3 are shown in FIG. 6 and FIG. 7.

The results shown in Table 2 and FIGS. 6, 7 demonstrate that in the switching elements of the Working Example 4 and Comparative Example 3, bistability is obtained for both the high-resistance states 71, 81 and the low-resistance states 72, 82, but the switching element of Working Example 4 of the present invention is clearly superior in terms of the threshold voltage, and the ratio of ON current and OFF current.

Thus, in the switching element of Working Example 4 shown in FIG. 6, in the high-resistance state 71, the OFF current (current in a high-resistance state) is about $3.8 \times 10^{-8}$ A/cm$^2$, but at a threshold voltage of Vth2=5.4 V, a transition is made from the high-resistance state 71 to the low-resistance state 72 and the ON current in the low-resistance state (current in the low-resistance state) becomes $1.1 \times 10^{-4}$ A/cm$^2$. A value of about $3 \times 10^3$ was obtained for the ratio of electric currents in the low-resistance state and high-resistance state.

By contrast, in Comparative Example 3, though bistability from the high-resistance state 81 to the low-resistance state was obtained, both the threshold voltage Vth2=1.8 V and ON/OFF ratio=6 were substantially less than those of Working Example 4.

Similarly, in Comparative Example 4 where no organic material layer 40 was present, the threshold voltage Vth2 was 4.6 V and the ON/OFF ratio was about 150, but in Working Example 5 where the organic material layer 40 was present, the threshold voltage Vth1 was 7.2 V and the ON/OFF ratio was about $6 \times 10^3$. In Working Example 6, the Vth1 was 8.0 V and the ON/OFF ratio was about $7 \times 10^3$, that is, the characteristics were clearly significantly improved over those of the element comprising no organic material layer.

INDUSTRIAL APPLICABILITY

As explained hereinabove, the present invention can provide a switching element suitable for mass production, wherein fluctuations of material composition can be inhibited and uniform bistable characteristic can be obtained. Therefore, this switching element can be advantageously used for as a switching element for driving the organic EL display panels or for a high-density memory.

The invention claimed is:

1. A switching element comprising:
    an organic bistable material having two stable values of resistance with respect to an applied voltage disposed between at least two electrodes; and
    an organic material layer provided between said organic bistable material layer and at least one of said electrodes,
    wherein electrically conductive fine particles are dispersed in said organic material layer.

2. The switching element according to claim 1, wherein the mean particle size of said electrically conductive fine particles is 5 nm or less and equal to or greater than the surface roughness Ra of the electrode that is in contact with said organic material layer.

3. The switching element according to claim 1, wherein said electrically conductive fine particles are selected from the group consisting of platinum and rhodium.

4. The switching element according to claim 1, wherein the surface roughness Ra in said organic material layer on the side of said organic bistable material layer is 1 nm or less.

5. The switching element according to claim 1, wherein the organic material constituting said organic material layer is at least one species selected from the group consisting of polycarbonates, polyesters, polyvinyl alcohol, polystyrene, polyvinyl pyrrolidone, polyimides, polyacrylic acid, polyethylene imine, tetramethylammonium, and citric acid.

6. The switching element according to claim 1, wherein said organic material layer is a coating.

7. The switching element according to claim 1, wherein said organic bistable material comprises at least one compound having an electron-donating functional ground or an electron-accepting functional group in a molecule.

* * * * *